(12) United States Patent
Ogata et al.

(10) Patent No.: US 11,828,786 B2
(45) Date of Patent: Nov. 28, 2023

(54) ELECTRICAL CHARACTERISTIC INSPECTION DEVICE FOR SEMICONDUCTOR DEVICE AND ELECTRICAL CHARACTERISTIC INSPECTION METHOD FOR SEMICONDUCTOR DEVICE

(71) Applicant: Mitsubishi Electric Corporation, Tokyo (JP)

(72) Inventors: Sumito Ogata, Tokyo (JP); Yasushi Hisaoka, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/499,607

(22) Filed: Oct. 12, 2021

(65) Prior Publication Data

US 2022/0229103 A1 Jul. 21, 2022

(30) Foreign Application Priority Data

Jan. 15, 2021 (JP) ................................ 2021-005098

(51) Int. Cl.
*G01R 31/26* (2020.01)

(52) U.S. Cl.
CPC ................................ *G01R 31/2607* (2013.01)

(58) Field of Classification Search
CPC ............ G01R 31/2601; G01R 31/2607; G01R 31/2889

(Continued)

(56) References Cited

U.S. PATENT DOCUMENTS

2021/0036618 A1* 2/2021 Lambert .......... G01R 19/16538

FOREIGN PATENT DOCUMENTS

JP 2009-168630 A 7/2009
JP 2013092534 A * 5/2013 ............. G01R 31/26

(Continued)

OTHER PUBLICATIONS

JP2013092534A Semiconductor Testing Device (Year: 2017).*

(Continued)

*Primary Examiner* — Jermele M Hollington
*Assistant Examiner* — Courtney G McDonnough
(74) *Attorney, Agent, or Firm* — Studebaker & Brackett PC

(57) ABSTRACT

An object is to provide a technique capable of creating a precise measurement condition in a facilitated manner relating to an electrical characteristic inspection for a semiconductor device. An electrical characteristic inspection device includes a storage unit configured to store a measurement condition of the semiconductor device being an inspection subject, a control unit configured to read out the measurement condition corresponding to inspection contents to be executed from the storage unit, an inductive inductance control circuit unit configured to set inductive inductance for the semiconductor device, and a floating inductance control circuit unit configured to set floating inductance for the semiconductor device. Based on the measurement condition read out from the storage unit, the control unit is configured to adjust the inductive inductance by controlling the inductive inductance control circuit unit, and adjust the floating inductance by controlling the floating inductance control circuit unit.

4 Claims, 6 Drawing Sheets

(58) Field of Classification Search
USPC .......................................................... 324/750
See application file for complete search history.

(56) References Cited

FOREIGN PATENT DOCUMENTS

| | | | |
|---|---|---|---|
| JP | 2013-160572 A | 8/2013 | |
| WO | WO-2019066865 A1 * | 4/2019 | ....... G01R 19/16538 |

OTHER PUBLICATIONS

An Office Action; "Notice of Reasons for Refusal," mailed by the Japanese Patent Office dated Sep. 5, 2023, which corresponds to Japanese Patent Application No. 2021-005098 and is related to U.S. Appl. No. 17/499,607; with English language translation.

* cited by examiner

F I G. 4

| Ls1[μH] | 0 | 0.1 | 0.2 | 0.3 | 0.4 | 0.5 | 0.6 | 0.7 | 0.8 | 0.9 | 1.0 |
|---|---|---|---|---|---|---|---|---|---|---|---|
| ON SUBTRACTION ADJUSTMENT SWITCH | 206-1 | 206-2 | 206-3 | 206-4 | 206-5 | 206-6 | 206-7 | 206-8 | 206-9 | 206-10 | — (OFF) |

F I G. 5

| Ls2[μH] ON ADDITION ADJUSTMENT SWITCH | 0 | 1 | 2 | 3 | 4 | 5 | 6 | 7 |
|---|---|---|---|---|---|---|---|---|
| | 203-1 203-2 203-3 | 203-2 203-3 | 203-1 203-3 | 203-3 | 203-1 203-2 | 203-2 | 203-1 | − (OFF) |

ELECTRICAL CHARACTERISTIC INSPECTION DEVICE FOR SEMICONDUCTOR DEVICE AND ELECTRICAL CHARACTERISTIC INSPECTION METHOD FOR SEMICONDUCTOR DEVICE

BACKGROUND OF THE INVENTION

Field of the Invention

The present disclosure relates to an electrical characteristic inspection device for a semiconductor device and an electrical characteristic inspection method for the semiconductor device.

Description of the Background Art

In the conventional electrical characteristic inspection device, by providing a circuit for adjusting an inductive inductance for the semiconductor device in the inspection device, the measurement current and the measurement voltage are supplied based on a measurement condition corresponding to the inspection contents to be conducted (for example, see Japanese Patent Application Laid-Open No. 2009-168630). Further, in the conventional electrical characteristic inspection device, when an abnormality in the supplied measurement current or measurement voltage is detected, the inspection device is protected by using a cutoff switch to conduct inspection.

SUMMARY

In the conventional electrical characteristic inspection device, while the measurement condition is created using a circuit for adjusting the inductive inductance for the semiconductor device in the inspection device, a mechanism for adjusting the floating inductance is not incorporated therein.

The floating inductance existing in the inspection device affects the increase/decrease of surge voltage and current change speed di/dt during inspection. In order to create a precise measurement condition considering such floating inductance, adjustment of wiring length in the inspection device and adjustment such as replacement of inductor are required, making it difficult to create a precise measurement condition.

An object of the present disclosure is to provide a technique capable of creating a precise measurement condition in a facilitated manner relating to an electrical characteristic inspection for a semiconductor device.

The electrical characteristic inspection device for a semiconductor device according to the present disclosure includes a storage unit, a control unit, an inductive inductance control circuit unit, and a floating inductance control circuit unit. The storage unit stores a measurement condition of the semiconductor device being an inspection subject. The control unit reads out the measurement condition corresponding to inspection contents to be executed. The inductive inductance control circuit unit sets inductive inductance for the semiconductor device. The floating inductance control circuit unit sets floating inductance for the semiconductor device. Based on the measurement condition read out from the storage unit, the control unit adjusts the inductive inductance by controlling the inductive inductance control circuit unit and adjusts the floating inductance by controlling the floating inductance control circuit unit. The control unit adjusts the floating inductance in addition to the inductive inductance; therefore, an adjustment of a wiring length and an adjustment such as the inductor replacement in the inspection device. are not required, ensuring to create a precise measurement condition in a facilitated manner in consideration of the floating inductance existing in the inspection device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a table illustrating a relationship between a switching state of subtraction adjustment switches and the inductance of a primary inductor included in the floating inductance control circuit unit;

FIG. 5 is a table illustrating a relationship between a switching state of addition adjustment switches and the inductance of a secondary inductor included in the floating inductance control circuit unit.

DESCRIPTION OF THE PREFERRED EMBODIMENTS

Embodiment

Figure 1:
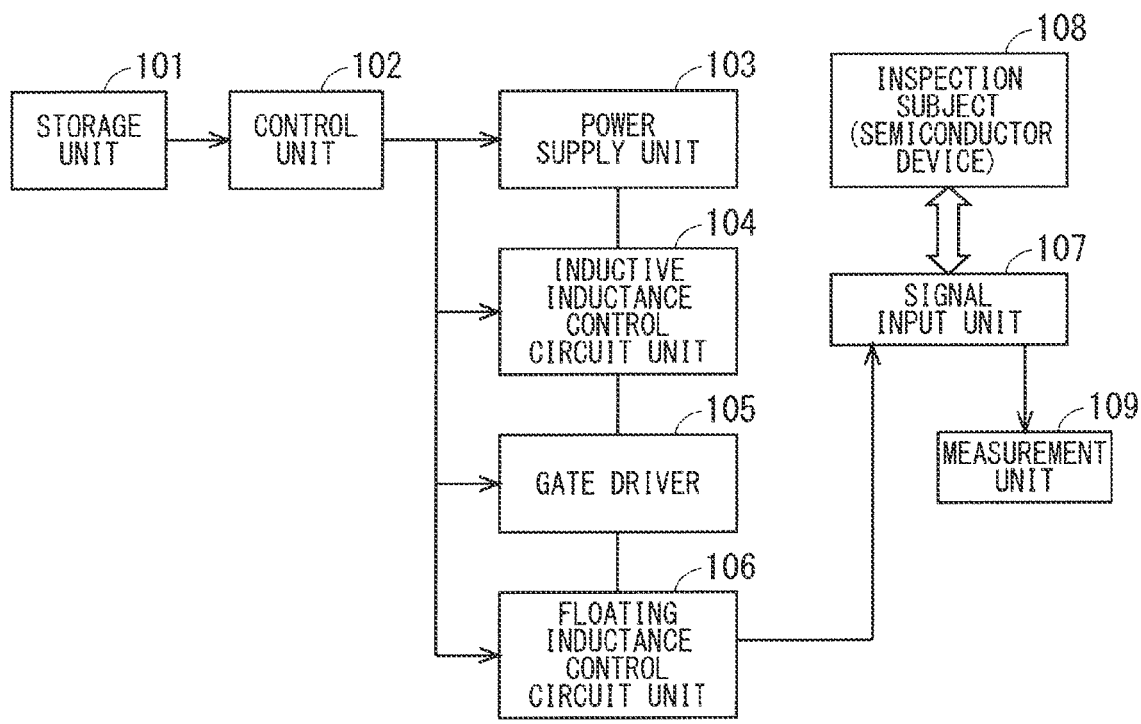
FIG. 1 is a block diagram illustrating an example of a configuration of an electrical characteristic inspection device for a semiconductor device according to Embodiment.

Hereinafter, Embodiment will be described with reference to the drawings. FIG. 1 is a block diagram illustrating an example of a configuration of an electrical characteristic inspection device 100 for a semiconductor device according to Embodiment.

As illustrated in FIG. 1, the electrical characteristic inspection device 100 is an inspection device that inspects a semiconductor device 108 being an inspection subject, and includes a storage unit 101, a control unit 102, a power supply unit 103, an inductive inductance control circuit unit 104, a gate driver 105, a floating inductance control circuit unit 106, a signal input unit 107, and a measurement unit 109.

The storage unit 101 is, for example, a Random Access Memory (RAM) or a Read Only Memory (ROM), and stores a plurality of measurement conditions of the semiconductor device 108.

The control unit 102 is, for example, a processor, and reads out a measurement condition corresponding to the inspection contents to be performed from the storage unit 101, and based on the read measurement condition, controls the power supply unit 103, the inductive inductance control circuit unit 104, the gate driver 105, and the floating inductance control circuit unit 106. The control unit 102 also controls the signal input unit 107 and the measurement unit 109.

The power supply unit 103 supplies the electric power required for the inspection. Specifically, the electric power supplied from the power supply unit 103 is supplied to the semiconductor device 108 via the signal input unit 107.

The inductive inductance control circuit unit 104 sets the inductive inductance L for the semiconductor device 108. A known technique is used for the inductive inductance control circuit unit 104. The inductive inductance control circuit unit 104 has, for example, a plurality of inductors and switches, and the inductors to be connected are switched by switching the switches.

The induct inductance L is set according to the contents of the L load test of the semiconductor device 108. The inductive inductance L is several hundred pH or more and several mH or less, and has a large inductance component. Therefore, in order to a create precise measurement condition, the floating inductance set by the floating inductance control circuit unit 106 to be described later is required to be adjusted. The gate driver 105 sets the gate voltage VGE and the gate resistance Rg of the semiconductor device 108 being the inspection subject based on the measurement condition read out from the storage unit 101 by the control unit 102. The gate driver 105 has, for example, a plurality of resistance elements and a switch, and the resistance elements to be connected are switched by switching the switch.

The floating inductance control circuit unit 106 sets the floating inductance Ls for the semiconductor device 108 based on the measurement condition read out from the storage unit 101 by the control unit 102. Although not illustrated in FIG. 1, the floating inductance control circuit unit 106 has a plurality of inductors and switches, and the inductors to be connected are switched by switching the switches. The details of the floating inductance control circuit unit 106 will be described later.

Here, the measurement condition is information including numerical values set for a VCE, the gate voltage VGE, the gate resistance Rg, the inductive inductance L, and the floating inductance Ls.

The signal input unit 107 supplies the electric power supplied from the power supply unit 103 to the semiconductor device 108 via the inductive inductance control circuit unit 104, the gate driver 105, and the floating inductance control circuit unit 106. The signal input unit 107 may be provided, for example, in a test head (not illustrated) included in the electrical characteristic inspection device 100.

The measurement unit 109 detects the voltage to be measured and the current to be measured of the semiconductor device 108 via the signal input unit 107. The control unit 102 may determine a fracture in the semiconductor device 108 in response to the change in the voltage to be measured. Also, the control unit 102 may determine a fracture in the semiconductor device 108 in response to the change in the current to be measured.

The semiconductor device 108 being the inspection subject is an electronic device that operates a predetermined action in response to a given current and voltage, and is, for example, an Insulated Gate Bipolar Transistor (IGBT), a metal-oxide-semiconductor field-effect transistor (MOSFET), or semiconductor element such as a diode. Further, the semiconductor device 108 includes a semiconductor device in which these electronic devices are combined and housed in one package, and a semiconductor device in which these electronic devices are mounted on a substrate to realize a predetermined function.

Figure 2:
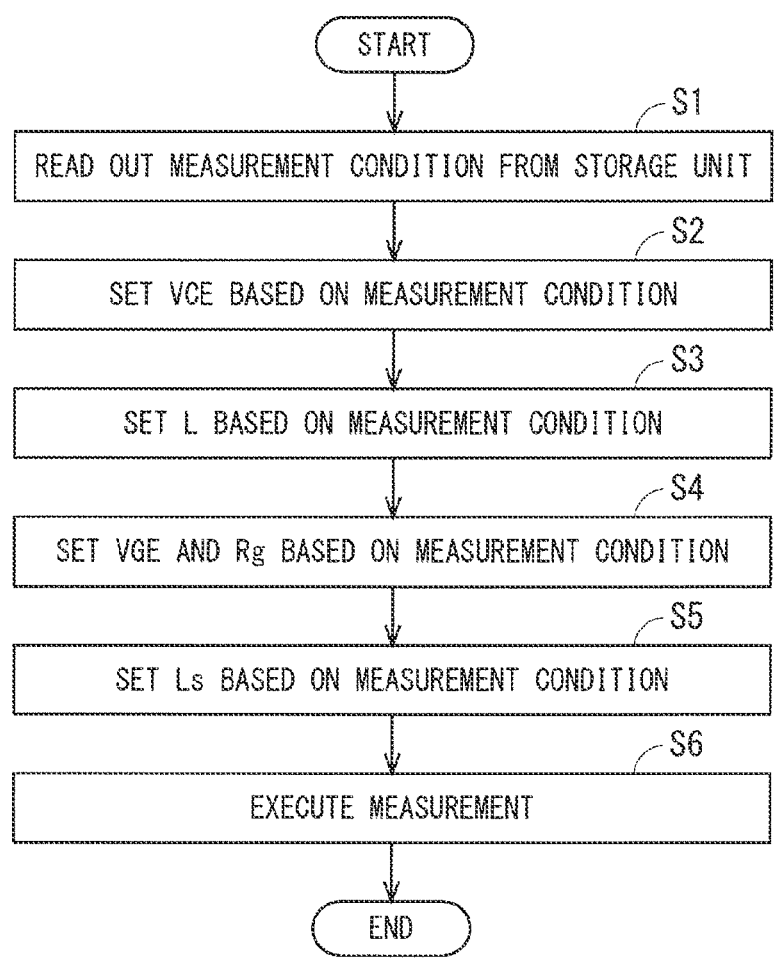
FIG. 2 is a flowchart illustrating an example of an electrical characteristic inspection method for the semiconductor device according to Embodiment.

Next, with reference to FIG. 2, an electrical characteristic inspection method for semiconductor device method using the electrical characteristic inspection device 100 will be described. FIG. 2 is a flowchart illustrating an example of an electrical characteristic inspection method for the semiconductor device.

As illustrated in FIG. 2, when the electrical characteristic inspection is started, the control unit 102 reads out the measurement condition corresponding to the inspection contents to be conducted from the storage unit 101 (Step S1). Next, the control unit 102 causes the power supply unit 103 to set the VCE based on the measurement condition read out from the storage unit 101 (Step S2).

Next, the control unit 102 causes the inductive inductance control circuit unit 104 to set the inductive inductance L based on the measurement condition read out from the storage unit 101 (Step S3). Here, the control unit 102 adjusts the inductive inductance L by switching the switches of the inductive inductance control circuit unit 104.

Next, the control unit 102 causes the gate driver 105 to set the gate voltage VGE and the gate resistance Rg based on the measurement condition read out from the storage unit 101 (Step S4).

Next, the control unit 102 causes the floating inductance control circuit unit 106 to set the floating inductance Ls based on the measurement condition read out from the storage unit 101 (Step S5). The method of adjusting the floating inductance Ls will be described later.

The setting based on the measurement condition in Steps S2 to S5 does not necessarily to be performed in this order and may be performed in any order.

Next, the control unit 102 starts measurement by supplying electric power to the semiconductor device 108 being the inspection subject via the signal input unit 107, and causes the measurement unit 109 to measure the voltage to be measured and the current to be measured (Step. S6). Then, the control unit 102 completes the electrical characteristic inspection after outputting the measurement result and the determination of the result to the display unit (not illustrated) included in the electrical characteristic inspection device 100.

Here, when there are a plurality of measurement conditions read out in Step S1, after the measurement based on one measurement condition is completed, the process may return to Step S2 to perform the setting and measurement based on the next measurement condition.

Figure 3:
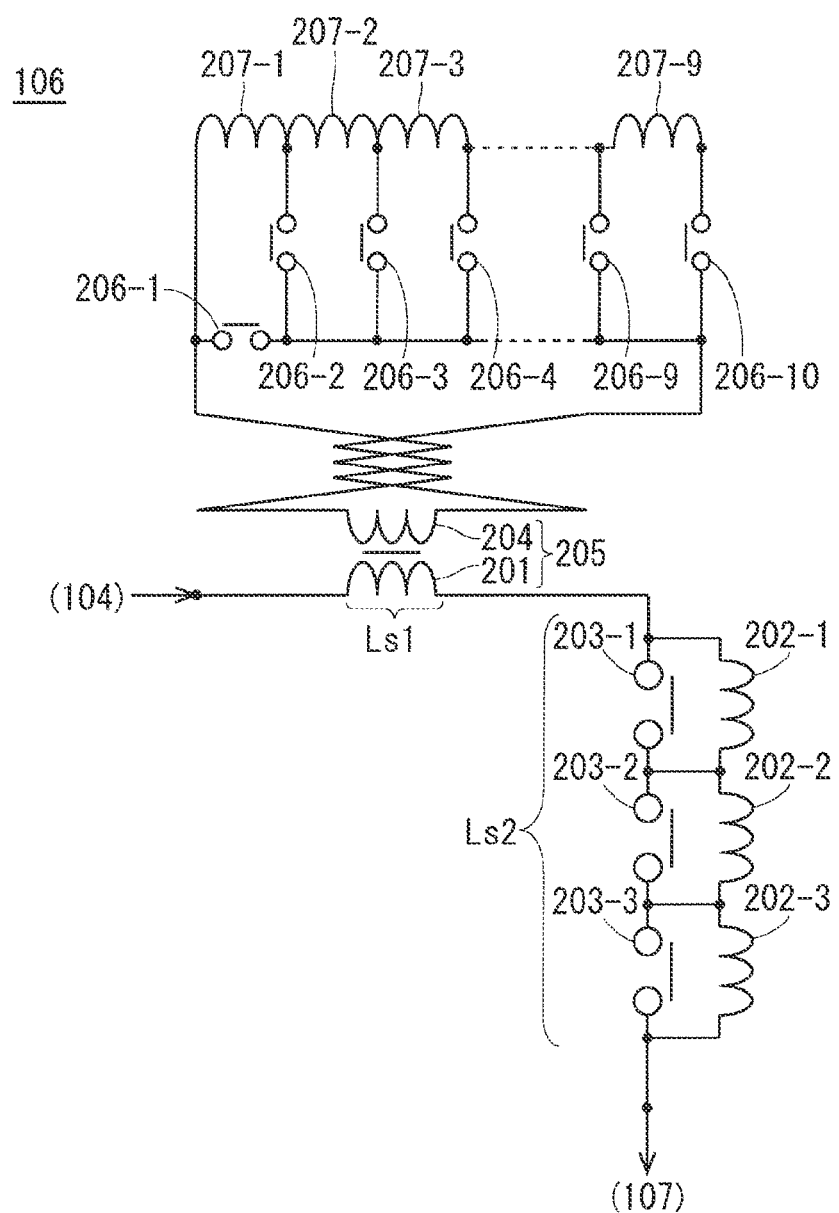
FIG. 3 is a circuit diagram illustrating an example of a configuration of a floating inductance control circuit unit included in the electrical characteristic inspection device for the semiconductor device according to Embodiment.

The details of the floating inductance control circuit unit 106 will be described with reference to FIGS. 3 to 5. FIG. 3 is a circuit diagram illustrating an example of a configuration of the floating inductance control circuit unit 106. FIG. 4 is a table illustrating the relationship between a switching state of the subtraction adjustment switches 206-1 to 206-10 and the inductance Ls1 of the primary inductor 201 included in the floating inductance control circuit unit 106. FIG. 5 is a table illustrating the relationship between a switching state of the addition adjustment switches 203-1 to 203-3 and the inductance Ls2 of the secondary inductor 204 included in the floating inductance control circuit unit 106.

As illustrated in FIG. 3, the floating inductance control circuit unit 106 includes a primary inductor 201, addition adjustment inductors 202-1 to 202-3, addition adjustment switches 203-1 to 203-3, a secondary inductor 204, subtraction adjustment switches 206-1 to 206-10, and subtraction adjustment inductors 207-1 to 207-9.

When the addition adjustment inductors 202-1 to 202-3 are not distinguished, they are described as an addition adjustment inductor 202. Similarly, when the addition adjustment switches 203-1 to 203-3, the subtraction adjustment switches 206-1 to 206-10, and the subtraction adjustment inductors 207-1 to 207-9 are not distinguished, they are respectively described as addition adjustment switches 203, subtraction adjustment switches 206, and subtraction adjustment inductors 207.

Also, as illustrated in FIG. 1, although the floating inductance control circuit unit 106 is arranged between the inductive inductance control circuit unit 104 and the signal input unit 107, the arrangement of the floating inductance control circuit unit 106 may be changed in accordance with a type of the semiconductor device 108 being the inspection subject or a configuration of circuits arranged around the floating inductance control circuit unit 106 as long as the adjustment of the floating inductance Ls would not be affected.

As illustrated in FIG. 3, the primary inductor 201 constitutes a transformer 205 with the secondary inductor 204, and is capable of subtracting the inductance Ls1 of the primary inductor 201 for adjustment by the interaction with the secondary inductor 204.

The subtraction adjustment inductors 207-1 to 207-9 are connected in series. The subtraction adjustment switches 206-1 to 206-10 switch the connection state between the secondary inductor 204 and the subtraction adjustment inductors 207-1 to 207-9. The number of subtraction adjustment inductors 207 to be connected in series with the secondary inductor 204 can be changed by the ON/OFF combination of the subtraction adjustment switches 206 as illustrated in FIG. 4.

As a result, based on the principle of the current transformer, the inductance Ls1 of the primary inductor 201 is finely adjusted in units of 0.1 [pH] by the ON/OFF combination of the subtraction adjustment switches 206 as illustrated in FIG. 4. Of the subtraction adjustment switches 206, a subtraction adjustment switch 206 which is not stated in the "ON subtraction adjustment switch" in FIG. 4, is OFF.

Further, the floating inductance control circuit unit 106 has a shield function for insulating the transformer 205 composed of the primary inductor 201 and the secondary inductor 204 against disturbance. Specifically, noise countermeasures are taken by physically providing a sufficient distance between the subtraction adjustment inductors 207 and the addition adjustment inductors 202, or by arranging a shield.

The addition adjustment inductors 202-1 to 202-3 are connected in series, and are connected in parallel with the addition adjustment switches 203-1 to 203-3, respectively. The addition adjustment switches 203-1 to 203-3 switch the connection state between the primary inductor 201 and the addition adjustment inductors 202-1 to 202-3. The number of addition adjustment inductors 202 connected in series with the primary inductor 201 can be changed by the ON/OFF combination of the addition adjustment switches 203 as illustrated in FIG. 5. Of the addition adjustment switches 203, an addition adjustment switch 203 which is not stated in the "ON addition adjustment switch" in FIG. 5, is OFF.

As a result, by combining ON/OFF of the addition adjustment switches 203 as illustrated in FIG. 5, the inductance Ls2 of the addition adjustment inductors 202 can be added to the inductance Ls1 of the primary inductor 201 for adjustment. In FIG. 5, it is illustrated that when the addition adjustment inductor 202-1 is 1 [pH], the addition adjustment inductor 202-2 is 2 [pH], and the addition adjustment inductor 202-3 is 4 [pH], the inductance Ls2 can be added in a unit of 1 [pH] while being roughly adjusted.

Depending on the combination of ON/OFF of the addition adjustment switches 203, the addition adjustment inductors 202 may perform addition by stepwisely increasing the inductance Ls2 in a manner of 1 [pH], 2 [pH], and 4 [pH].

In present Embodiment, the floating inductance Ls can be set by finely adjusting the floating inductance by subtraction and roughly adjusting the floating inductance by addition. That is, the floating inductance Ls is calculated by adding the inductance Ls1 and the inductance Ls2.

Figure 6:
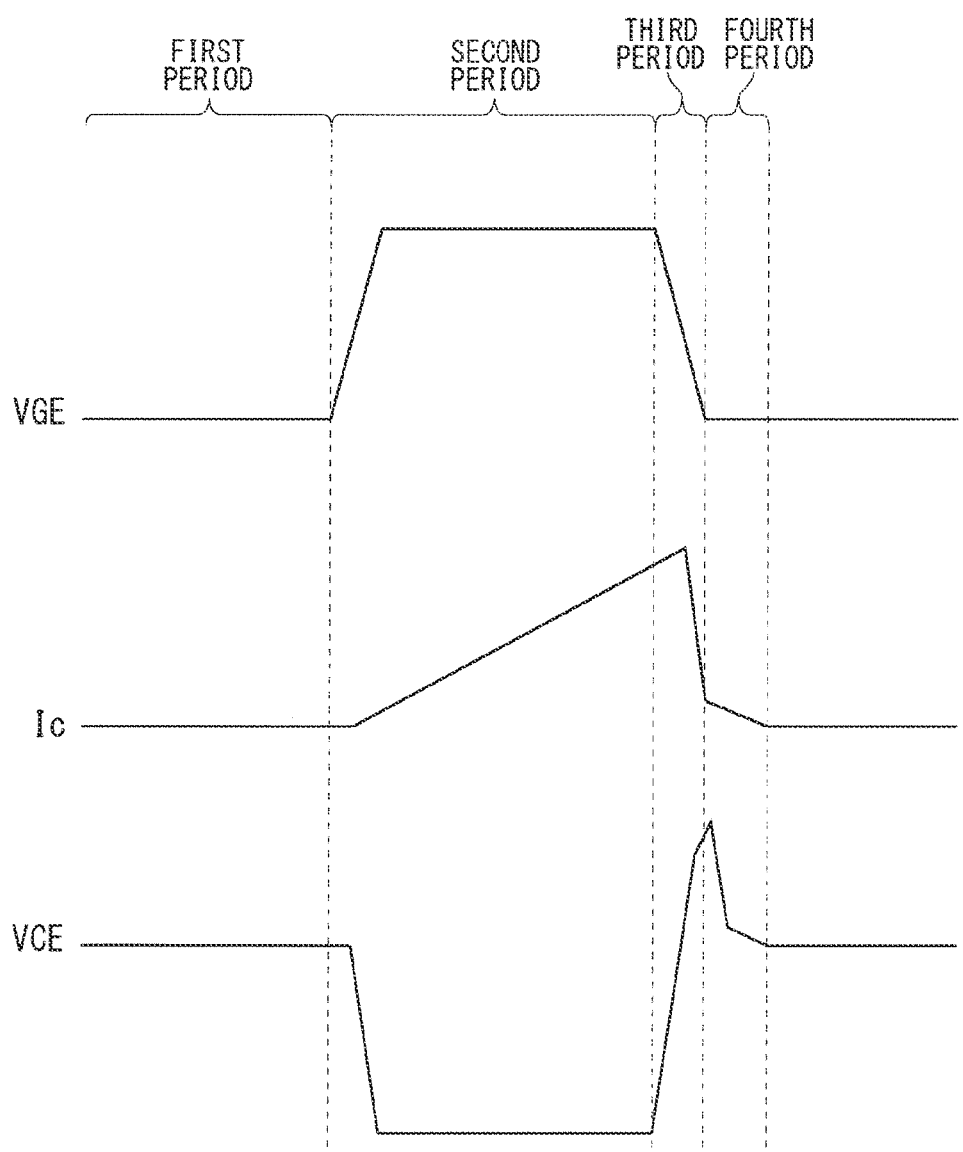
FIG. 6 is a diagram illustrating waveforms of a measurement voltage and a measurement current in the RBSOA test.

Next, with reference to FIG. 6, a case where a Reverse Biased Safe Operating Area (RBSOA) test is conducted using an IGBT having a collector terminal, an emitter terminal and a gate terminal on the semiconductor device 108 being the inspection subject will be described. FIG. 6 is a diagram illustrating waveforms of a measurement voltage and a measurement current in the RBSOA test.

Here, the VGE illustrated in FIG. 6 indicates the voltage between the gate terminal and the emitter terminal of the semiconductor device 108 being the inspection subject. VCE indicates the voltage between the collector terminal and the emitter terminal of the semiconductor device 108. Ic indicates the collector current between the collector terminal and the emitter terminal of the semiconductor device 108.

As illustrated in FIG. 6, in a first period, the semiconductor device 108 is in a non-conducting state in which no voltage is applied to the gate terminal. Therefore, the inductive inductance control circuit unit 104 does not supply the measurement current Ic to the semiconductor device 108. Further, a divided voltage of the power supply voltage is applied as a voltage VCE between the collector terminal and the emitter terminal of the semiconductor device 108.

In a second period, the semiconductor device 108 is brought into a conductive state by the application of a voltage to the gate terminal. When the semiconductor device 108 is brought into a conductive state, the measurement current Ic flows between the collector terminal and the emitter terminal. The measurement current Ic is supplied via the inductive inductance control circuit unit 104; therefore, the current value rises at a rate of change corresponding to the inductive inductance L of the inductive inductance control circuit unit 104, and energy is accumulated in the inductive inductance control circuit unit 104. Further, when the semiconductor device 108 is brought into a conductive state, the voltage VCE between the collector terminal and the emitter terminal of the semiconductor device 108 approaches 0.

In a third period, the semiconductor device 108 is brought into a non-conducting state due to the cutoff of the voltage applied to the gate terminal by the gate driver 105. When the semiconductor device 108 is brought into the non-conducting state, the measurement current Ic stops flowing between the collector terminal and the emitter terminal of the semiconductor device 108. The measurement current Ic at this time may be returned by a freewheel diode or the like to consume energy. Further, when the semiconductor device 108 is brought into the non-conducting state, the voltage VCE between the collector terminal and the emitter terminal rises to a value obtained by adding a surge voltage to the divided voltage of the power supply voltage.

In a fourth period, a tail current Ic flows between the collector terminal and the emitter terminal of the semiconductor device 108. The magnitude of the tail current Ic depends on the magnitude of the floating inductance Ls existing in the circuit, and the larger the floating inductance Ls, the larger the tail current Ic. Further, the larger the tail current Ic, the longer the time for the tail current Ic to flow.

Meanwhile, the maximum value of the voltage VCE between the collector terminal and the emitter terminal of the semiconductor device 108 also depends on the magnitude of the floating inductance Ls existing in the circuit, and the larger the floating inductance Ls, the larger the surge voltage VCE. The adjustment of the floating inductance Ls in this manner ensures control of the surge voltage VCE and tail current Ic during inspection.

As described above, the electrical characteristic inspection device 100 according to Embodiment includes the storage unit 101 that stores a measurement condition of the semiconductor device 108 being the inspection subject, the control unit 102 that reads out the measurement condition corresponding to inspection contents to be executed from the storage unit 101, the inductive inductance control circuit unit 104 that sets the inductive inductance L for the semiconductor device 108, the floating inductance control circuit unit 106 that sets the floating inductance Ls for the semiconductor device 108, in which, based on the measurement condition read out from the storage unit 101, the control unit 102 adjusts the inductive inductance L by controlling the inductive inductance control circuit unit 104, and adjusts the floating inductance Ls by controlling the floating inductance control circuit unit 106.

Therefore, the control unit 102 adjusts the floating inductance Ls in addition to the inductive inductance L; therefore, an adjustment of a wiring length and an adjustment such as the inductor replacement in the electrical characteristic inspection device 100 are not required, ensuring to create a precise measurement condition in a facilitated manner in consideration of the floating inductance Ls existing in the electrical characteristic inspection device 100.

As described above, the control unit 102 is capable of easy adjustment of the floating inductance Ls; therefore, in the electrical characteristic inspection device 100, accurate reproduction of the inspection under the same measurement condition as the previously performed inspection is ensured.

Further, the floating inductance control circuit unit 106 includes the primary inductor 201, the secondary inductor 204 constituting the transformer 205 with the primary inductor 201, the plurality of addition adjustment inductors 202 connectable to the primary inductor 201, the addition adjustment switches 203 that adjust the inductance Ls2 of the secondary inductor 204 by switching the connection state between the primary inductor 201 and each of the addition adjustment inductors 202, the plurality of subtraction adjustment inductors 207 connectable to the secondary inductor 204, and the subtraction adjustment switches 206 that adjust the inductance Ls1 of the primary inductor 201 by switching the connection state between the secondary inductor 204 and each of the subtraction adjustment inductors 207, in which the control unit 102 adjusts the floating inductance Ls by the inductance Ls1 of the primary inductor 201 and the inductance Ls2 of the secondary inductor 204 by controlling the addition adjustment switches 203 and the subtraction adjustment switches 206.

Therefore, the adjustment of the floating inductance Ls in a facilitated manner is ensured by the interaction between the primary inductor 201 and the secondary inductor 204.

Further, the floating inductance control circuit unit 106 has a shield function for insulating the transformer 205 against disturbance; therefore, the adjustment accuracy of the floating inductance Ls is improved by suppressing the disturbance to the transformer 205.

Embodiment can be appropriately modified.

While the invention has been shown and described in detail, the foregoing description is in all aspects illustrative and not restrictive. It is therefore understood that numerous modifications and variations can be devised without departing from the scope of the invention.

What is claimed is:

1. An electrical characteristic inspection device for a semiconductor device comprising:
   a storage unit configured to store a measurement condition of the semiconductor device being an inspection subject;
   a control unit configured to read out the measurement condition corresponding to inspection contents to be executed from the storage unit;
   an inductive inductance control circuit unit configured to set inductive inductance for the semiconductor device; and
   a floating inductance control circuit unit configured to set floating inductance for the semiconductor device, wherein,
   based on the measurement condition read out from the storage unit, the control unit is configured to adjust the inductive inductance by controlling the inductive inductance control circuit unit, and adjust the floating inductance by controlling the floating inductance control circuit unit.

2. The electrical characteristic inspection device for a semiconductor device according to claim 1, wherein
   the floating inductance control circuit unit includes
      a primary inductor,
      a secondary inductor constituting a transformer with the primary inductor,
      a plurality of addition adjustment inductors connectable to the primary inductor,
      addition adjustment switches configured to adjust inductance of the second inductor by switching a connection state between the primary inductor and each of the addition adjustment inductors,
      a plurality of subtraction adjustment inductors connectable to the secondary inductor, and
      subtraction adjustment switches configured to adjust inductance of the primary inductor by switching a connection state between the secondary inductor and each of the subtraction adjustment inductors, and
   the control unit is configured to adjust the floating inductance by the inductance of the primary inductor and the inductance of the secondary inductor by controlling the addition adjustment switches and the subtraction adjustment switches.

3. The electrical characteristic inspection device for a semiconductor device according to claim 2, wherein
   the floating inductance control circuit unit includes a shield function for insulating the transformer against disturbance.

4. An electrical characteristic inspection method for the semiconductor device using the electrical characteristic inspection device for the semiconductor device according to claim 1, comprising the steps of: (a) reading out the measurement condition corresponding to the inspection contents to be executed from the storage unit; (b) setting the inductive inductance based on the measurement condition read out from the storage unit; (c) setting the floating inductance based on the measurement condition read out from the storage unit; and (d) executing measurement of the semiconductor device.

* * * * *